United States Patent [19]

Collins et al.

[11] Patent Number: 6,090,303
[45] Date of Patent: *Jul. 18, 2000

[54] PROCESS FOR ETCHING OXIDES IN AN ELECTROMAGNETICALLY COUPLED PLANAR PLASMA APPARATUS

[75] Inventors: Kenneth S. Collins, San Jose; Jeffrey Marks, Sunnyvale, both of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/761,045

[22] Filed: Dec. 5, 1996

Related U.S. Application Data

[63] Continuation of application No. 08/289,336, Aug. 11, 1994, abandoned, which is a continuation of application No. 07/984,045, Dec. 1, 1992, abandoned, and a continuation-in-part of application No. 07/722,340, Jun. 27, 1991, abandoned.

[51] Int. Cl.$^7$ .............................. H05H 1/00; H01L 21/00
[52] U.S. Cl. ...................... 216/68; 156/345; 118/723 I; 438/729
[58] Field of Search .......................... 156/345; 438/729; 118/723 I; 216/68; 204/298.34

[56] References Cited

U.S. PATENT DOCUMENTS

| | | |
|---|---|---|
| 4,123,316 | 10/1978 | Tsuchimoto . |
| 4,261,762 | 4/1981 | King . |
| 4,427,516 | 1/1984 | Levinstein et al. . |

(List continued on next page.)

FOREIGN PATENT DOCUMENTS

| | | |
|---|---|---|
| 0 403 418 A2 | 12/1990 | European Pat. Off. . |
| 0 413 282 A2 | 2/1991 | European Pat. Off. . |
| A1-520 519 | 12/1992 | European Pat. Off. . |

(List continued on next page.)

OTHER PUBLICATIONS

Patent Abstracts of Japan, Publication No. 57045927 A, Mar. 16, 1982 (Fujitsu Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokoyo Electron Ltd).

Patent Abstracts of Japan, Publication No. 08017799 A, Jan. 19, 1996 (Plasma Syst:KK).

Patent Abstracts of Japan, Publication No. 62052714 A, Mar. 7, 1987 (Olympus Optical Co. Ltd; Toagosei Chem Ind Co Ltd).

Coburn, W.J. "Increasing the Etch Rate Ratio o$SiO_2$/Si in Fluorocarbon Plasma Etching", IBM Technical Disclosure, vol. 19, No. 10, Mar. 1977.

Matsuo, Seitaro. "Selective etching of $SiO_2$ relative to Si by plasma reactive sputter etching", J. Vac. Sc. Technology, vol. 17, No. 2, Mar.–Apr. 1980.

*Primary Examiner*—Thi Dang
*Attorney, Agent, or Firm*—Michaelson and Wallace

[57] ABSTRACT

In an apparatus for producing an electromagnetically coupled planar plasma comprising a chamber having a dielectric shield in a wall thereof and a planar coil outside of said chamber and adjacent to said window coupled to a radio frequency source, the improvement whereby a scavenger for fluorine is mounted in or added to said chamber. When a silicon oxide is etched with a plasma of a fluorohydrocarbon gas, the fluorine scavenger reduces the free fluorine radicals, thereby improving the selectivity and anisotropy of etching and improving the etch rate while reducing particle formation.

34 Claims, 1 Drawing Sheet

U.S. PATENT DOCUMENTS

| | | |
|---|---|---|
| 4,427,762 | 1/1984 | Takahashi et al. . |
| 4,430,547 | 2/1984 | Yoneda et al. . |
| 4,457,359 | 7/1984 | Holden . |
| 4,512,391 | 4/1985 | Harra . |
| 4,565,601 | 1/1986 | Kakehi et al. . |
| 4,711,698 | 12/1987 | Douglas . |
| 4,756,810 | 7/1988 | Lamont, Jr. et al. . |
| 4,786,352 | 11/1988 | Benzing . |
| 4,786,359 | 11/1988 | Stark et al. . |
| 4,793,897 | 12/1988 | Dunfield et al. . |
| 4,807,016 | 2/1989 | Douglas . |
| 4,810,935 | 3/1989 | Boswell . |
| 4,842,683 | 6/1989 | Cheng et al. . |
| 4,870,245 | 9/1989 | Price et al. . |
| 4,918,031 | 4/1990 | Flamm et al. . |
| 4,948,458 | 8/1990 | Ogle . |
| 4,990,229 | 2/1991 | Campbell et al. . |
| 5,000,113 | 3/1991 | Wang et al. . |
| 5,015,330 | 5/1991 | Okumura et al. . |
| 5,074,456 | 12/1991 | Degner et al. . |
| 5,187,454 | 2/1993 | Collins et al. . |
| 5,203,956 | 4/1993 | Hansen . |
| 5,241,245 | 8/1993 | Barnes et al. . |
| 5,249,251 | 9/1993 | Egalon et al. . |
| 5,258,824 | 11/1993 | Carlson et al. . |
| 5,276,693 | 1/1994 | Long et al. . |
| 5,277,751 | 1/1994 | Ogle . |
| 5,326,404 | 7/1994 | Sato . |
| 5,346,578 | 9/1994 | Benzing et al. . |
| 5,349,313 | 9/1994 | Collins et al. . |
| 5,392,018 | 2/1995 | Collins et al. . |
| 5,399,237 | 3/1995 | Keswick et al. . |
| 5,401,350 | 3/1995 | Patrick et al. . |
| 5,414,246 | 5/1995 | Shapona . |
| 5,423,945 | 6/1995 | Marks et al. ............................ 438/695 |
| 5,477,975 | 12/1995 | Rice et al. . |
| 5,529,657 | 6/1996 | Ishii . |
| 5,556,501 | 9/1996 | Collins et al. . |

FOREIGN PATENT DOCUMENTS

| | | |
|---|---|---|
| 0 552 490 A1 | 7/1993 | European Pat. Off. . |
| A1-552 491 | 7/1993 | European Pat. Off. . |
| 0 601 468 A1 | 6/1994 | European Pat. Off. . |
| 0 651 434 A2 | 3/1995 | European Pat. Off. . |
| 0 680 072 A2 | 11/1995 | European Pat. Off. . |
| 0 727 807 A1 | 8/1996 | European Pat. Off. . |
| 0 742 577 A2 | 11/1996 | European Pat. Off. . |
| 55-154582 | 12/1980 | Japan . |
| 61-147531 | 12/1984 | Japan . |
| 61-91377 | 5/1986 | Japan . |
| 62-12129 | 1/1987 | Japan . |
| 63-9120 | 1/1988 | Japan . |
| WO92/20833 | 11/1992 | WIPO . |

PROCESS FOR ETCHING OXIDES IN AN ELECTROMAGNETICALLY COUPLED PLANAR PLASMA APPARATUS

This is a continuation of application Ser. No. 08/289,336, filed Aug. 11, 1994 which is a continuation of Ser. No. 07/984,045 filed Dec. 1, 1992 now abandoned and a continuation-in-part of Ser. No. 07/722,340 filed Jun. 27, 1991 abandoned.

This invention relates to an improved process and apparatus for etching oxides in an electromagnetically coupled planar plasma apparatus.

BACKGROUND OF THE INVENTION

U.S. Pat. No. 4,948,458 to Ogle describes an apparatus for producing planar plasmas that can operate over a wide pressure range. The apparatus is a vacuum chamber having a dielectric window or shield in one wall of the chamber. A planar coil, outside of the chamber and proximate to the dielectric shield, and an RF source is coupled to the coil. The chamber is also fitted with a port for the inlet of plasma precursor gases into the chamber, and a port for ingress and egress of a substrate to be processed, as well as a support for the substrate parallel to the dielectric window. When an RF current is applied to the coil, a changing magnetic field is induced which extends inside the chamber through the dielectric shield, inducing a circular flow of electrons within the processing region of the chamber. This induced circular electric field is substantially in a plane parallel to the planar coil, which reduces the transfer of kinetic energy in the non-planar direction. The substrate to be etched is also mounted in the direction of the plane of the plasma and thus the velocity component of charged particles in the non-planar direction with respect to the substrate during processing is minimized, and the treatment on the substrate is generally limited to the chemical interaction of the plasma species with the substrate, except in the case where RF bias is applied to the substrate with respect to a grounded electrode or chamber. The entire disclosure of U.S. Pat. No. 4,948,458 is incorporated herein by reference.

The above plasma reactor is useful for etching materials such as aluminum, but it has limitations with respect to etching oxides such as silicon oxide, which are required in the manufacture of semiconductor devices. Silicon oxide films and layers, for example, are applied to various substrates during the manufacture of silicon devices, including silicon, metal layers, silicon nitride and the like. Typically a photoresist is deposited over the silicon oxide layer to be etched and patterned, and the silicon oxide etched with a fluorohydrocarbon gas such as $CF_4$, $C_2F_6$, $C_3F_8$, $CHF_3$ and the like. For example, a via in a silicon oxide layer over polysilicon may be etched and the via later filled in with a conductor to make contact between the underlying polysilicon and a conductive layer overlying the silicon oxide. In order to fill in vias, which are becoming smaller and deeper, the etch process has several stringent requirements; the sidewalls of the vias must be straight (anisotropic etch) and the etching must be selective with respect to the overlying photoresist layer and the underlying material, i.e., the etch process must etch the silicon oxide layer at least at a faster rate than overlying and underlying layers, and preferably the selectivity should be higher than about 10:1. For other semiconductor devices and arrays, large and small features are present and must be etched at the same time, requiring that large and small features in the same material, e.g., silicon oxide, be etched at the same rate, i.e., without microloading. Microloading for purposes herein is defined as $$1 - \left(\frac{\text{etch rate small features}}{\text{etch rate large features}}\right)$$

Still further, since silicon oxide layers are generally quite thick, high etch rates are also desirable, particularly when single wafer processing is being performed (as opposed to batch-type processing) to permit high throughput.

The etch reactor of Ogle, while useful to etch conductive metal layers, cannot meet the above-described etch requirements for oxides such as silicon oxide. In general silicon oxide is etched with fluorine-containing etch gases, as noted above. Silicon oxide is etched with poor selectivity; using gases with a high C:F ratio, or gases containing hydrogen raises selectivity but sacrifices etch rate and produces tapered profiles and microloading. Thus merely increasing the carbon:fluorine ratio of the etch gas, or increasing the gas flow rates, increases the taper of the sidewalls, increases microloading and reduces the etch rate. Fluorohydrocarbon etch gases in addition form polymeric solids that can form particles which deposit on the substrate, causing contamination of the substrate during the etch process.

Thus a means for improving etching of oxide films or layers in the above-described electromagnetically coupled planar plasma equipment would be highly desirable.

SUMMARY OF THE INVENTION

We have found that the addition of a scavenger for fluorine in the electromagnetically coupled planar plasma apparatus improves the etching of oxides with fluorohydrocarbon etchants with respect to the selectivity of etching of the oxide, gives improved anisotropy and improved etch rates.

DETAILED DESCRIPTION OF THE INVENTION

Figure 1:
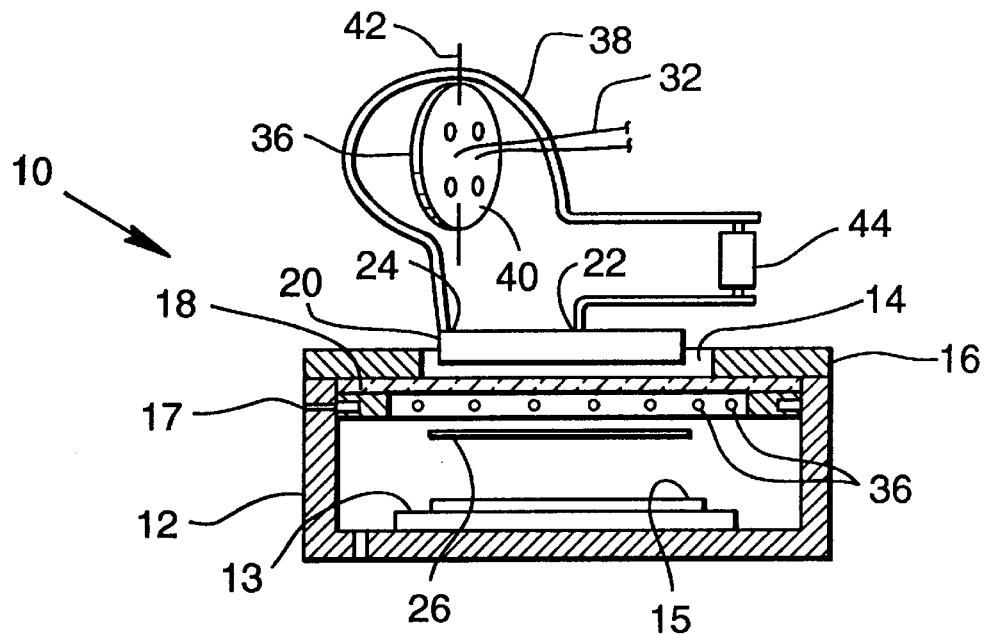
FIG. 1 is a cross sectional view of the apparatus of the invention.

The invention will be further described with reference to FIG. 1. A plasma treatment apparatus 10 suitable for etching single semiconductor wafers includes a vacuum chamber 12 having an access port 14 in an upper wall 16 of the chamber 12. A dielectric shield 18 is disposed below the upper wall 16 and extends across the access port 14. The dielectric shield 18 is sealed to the upper wall 16 to define the vacuum sealable chamber 12. The chamber 12 also has a port 17 for admittance of plasma precursor gases to the chamber 12.

A planar coil 20 is disposed within the access port 14 adjacent to the dielectric shield 18. The coil 20 is formed as a spiral having a center tap 22 and an outer tap 24. The plane of the coil 20 is oriented parallel to both the dielectric shield 18 and a support 13 for a wafer 15 to be processed in the chamber 12. The coil 20 is thus able to produce a planar plasma within the chamber 12 which is parallel to the wafer. The distance between the coil 20 and the support surface 13 is usually in the range from about 3–15 cm and can be adjusted. A scavenger for fluorine, illustrated as a silicon article 26, is situate between the support surface 13 and proximate to the dielectric shield 18. Thus the fluorine scavenger is in or near the generated plasma.

Figure 2:
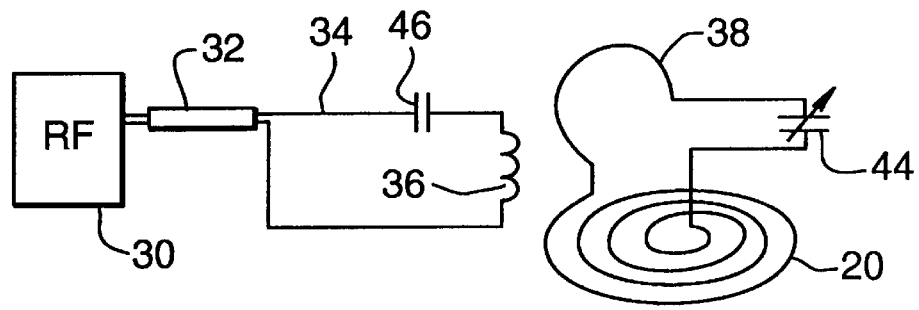
FIG. 2 is a schematic illustration of the circuitry for the apparatus of FIG. 1.

Referring now to FIGS. 1 and 2, the planar coil 20 is driven by an RF generator 30 of the type which can operate at a frequency in the range from about 100 KHz up to 100 MHz, and preferably at less than or equal to about 13.56 MHz. The output of the generator 30 is fed by a coaxial cable 32 to a matching circuit 34. The matching circuit 34 includes a primary coil 36 and a secondary loop 38 which may be positioned to allow effective coupling of the circuit and for loading of the circuit at the frequency of operation. The primary coil 36 may be mounted on a disk 40 which can rotate about a vertical axis 42 to adjust the coupling. A variable capacitor 44 is in series with the secondary loop 38 to adjust the circuit resonant frequency with the frequency output of the RF generator 30. Impedance matching maximizes the efficiency of power transfer to the planar coil 20. Additional capacitance 46 may be provided in the primary circuit to cancel part of the inductive reactance of the coil 36 in the circuit.

An RF bias power can be applied to the substrate via the substrate support 13 when etching oxides in the chamber 12. A second RF signal may be passed from the RF bias 30 or a separate RF source (not shown) may be connected to the substrate support 13. The walls of the chamber 12 act as the grounded electrode in that case. Another alternative is to use the planar coil, or the silicon or other solid fluorine scavenger article as a counterelectrode. The RF bias power controls the substrate sheath voltage.

Figure 3:
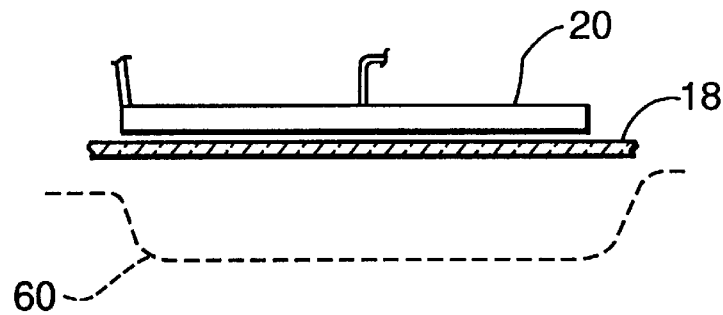
FIG. 3 is a schematic view illustrating the electromagnetic field profile produced by the apparatus of FIG. 1.

Referring now to FIG. 3, the planar coil 20 induces an electromagnetic field which penetrates the dielectric shield 18 and has a field strength profile 60 as shown in broken line. The uniform electromagnetic field provides a uniform circulating field of electrons in the electromagnetic field region which impact the precursor gas molecules, creating plasma species within the plasma region. Because there will be little or no impact on the substrate in the non-planar direction, except as deliberately caused with RF bias power, the reactive plasma species will cause little damage to the wafer.

The fluorine scavenger, when it is a solid article, should be situated above and parallel to the surface being etched and adjacent to the dielectric shield for maximum effectiveness and good uniformity over large substrates, such as 200 mm diameter silicon wafers. When it is a solid article, such as silicon plate 26, the fluorine scavenger must be placed and sized so that it will not interfere with the RF induction field generated through the dielectric shield. This can be done by considering the thickness of the solid article, its resistivity as a function of temperature and the frequency of the RF power to be inductively coupled to the coil. The RF power frequency and the article thickness and resistivity must be chosen so that at the highest solid article operating temperature, when its resistivity is lowest, the skin depth of the RF electromagnetic field in the fluorine scavenger is large with respect to the article thickness. Typically this requires a low frequency, less than 13.56 MHz operation, with, for example, thin silicon plates of less than several millimeters thickness. The resistivity of the solid scavenger source also can be varied, such as by providing a doped silicon plate, because the dopants will decrease the silicon resistivity at operating temperatures of up to several hundred degrees centigrade. In order to provide process stability, temperature control of the scavenger source can also be provided.

The present process is predicated on the fact that when a fluorohydrocarbon precursor gas is exposed to a plasma generating field, various fragments are generated, including F, CF and $CF_2$ radicals. The free fluorine etches oxides such as silicon oxide, but other species form C-F polymers, generally containing about 50% of fluorine, that can deposit onto the sidewalls of the etched via and also act to protect underlying and overlying layers from being etched. However, this polymer is attacked by oxygen, generated by the silicon oxide, and also by free fluorine, and thus the selectivity between silicon oxide and other materials on the substrate being etched is not high. However, when a scavenger for fluorine is provided in the plasma, such as a silicon source, the scavenger takes up free fluorine, thus reducing attack of the substrate by free fluorine. Further, when fewer free fluorine radicals are present in the plasma, the protective polymer becomes carbon-rich, e.g., contains only about 40% by weight of fluorine.

The scavenger for fluorine can most easily be provided in the form of a solid silicon article, e.g., a plate or slice, in or near the plasma. However, other sources of silicon can be provided, such as silane or other silicon-containing gases including TEOS, diethyl silane, tetrafluorosilane and the like, added to the plasma precursor gases. Compounds of carbon are also suitable scavengers for fluorine. For example, a carbon-rich gas such as benzene ($C_6H_6$) or acetylene ($C_2H_2$) can be added to the plasma precursor gases. A solid carbon-containing compound such as graphite or silicon carbide can also be used and substituted for a silicon plate. Again, the thickness of the carbon-containing article must be small as compared to the skin depth of the applied RF power at the temperature of use. If the fluorine scavenger source is located outside of the plasma region, it can be heated to a temperature that will pass free silicon or carbon atoms into the plasma. In such case a means of heating the silicon or carbon source can also be provided. The shape of the solid article can be a plate, a ring or a cylinder, for example.

Although the invention has been described in terms of particular embodiments, the invention is not meant to be so limited. For example, if the spacing between the dielectric window and the substrate is large, so that diffusion of active plasma species to other parts of the chamber can occur, the fluorine scavenger can be placed in alternate locations, such as in a ring around the substrate or at an edge of the dielectric window. In such cases, the RF induction field need not penetrate the solid fluorine scavenger, and the requirement of large RF skin depth in solid fluorine scavengers, as described hereinabove, is not required. Other variations of placement and materials will suggest themselves to one skilled in the art and are to be included herein. The invention is only to be limited by the appended claims.

We claim:

1. A method of processing a workpiece, comprising:
   providing a vacuum chamber and a base for supporting said workpiece within said chamber and for coupling a bias potential to said workpiece;
   providing an inductive antenna in juxtaposition to said base for coupling plasma source power into said chamber;
   providing a counterelectrode between said inductive antenna and said base, wherein said counterelectrode comprises at least one of: (a) silicon, (b) carbon; and
   introducing a plasma precursor gas into said chamber.

2. The method of claim 1 wherein said etch precursor gas comprises a flourine-containing gas and wherein the step of providing a counter electrode further comprises providing a counter electrode comprised of a semiconductor material which is a scavenger for flourine.

3. The method of claim 1 wherein providing said counterelectrode comprises providing a doped silicon counterelectrode.

4. The method of claim 1 wherein providing said counterelectrode comprises providing said counterelectrode comprising silicon carbide.

5. A method of processing a workpiece, comprising:
providing a vacuum chamber and a base for supporting said workpiece within said chamber;
providing an inductive antenna in juxtaposition to said base for coupling plasma source power into said chamber;
providing a counter electrode between said inductive antenna and said base, wherein said counter electrode comprises at least one of: (a) silicon, (b) carbon;
connecting an RF power source across said counter electrode and said base; and
introducing a plasma precursor gas into said chamber.

6. The method of claim 5 wherein said etch precursor gas comprises a fluorine-containing gas and wherein said counterelectrode comprises a semiconductor material which is a scavenger for fluorine.

7. The method of claim 5 wherein said counterelectrode comprises doped silicon.

8. The method of claim 5 wherein providing said counterelectrode comprises providing said counterelectrode comprising silicon carbide.

9. A plasma reactor for processing a workpiece, said reactor comprising:
a reactor enclosure defining a processing chamber;
a base within said chamber for supporting said workpiece and applying a bias RF potential thereto;
a counterelectrode overlying said base, wherein said counterelectrode comprises at least one of: (a) silicon, (b) carbon; and
an inductive antenna overlying said counterelectrode.

10. The reactor of claim 9 wherein said counterelectrode comprises doped silicon.

11. The reactor of claim 9 further comprising a gas inlet of said chamber for providing a fluorine-containing gas, wherein said counterelectrode comprises a semiconductor material which is a scavenger for fluorine.

12. The reactor of claim 11 wherein said fluorine-containing gas comprises a fluorohydrocarbon etch gas.

13. The reactor of claim 9 wherein said counterelectrode comprises silicon carbide.

14. An apparatus for producing a plasma, comprising:
a chamber having a port for a plasma precursor gas to fed to said chamber;
an inductive antenna disposed at a side of said chamber;
a substrate support within said chamber for holding a substrate to be processed in juxtaposition to said inductive antenna and for applying an RF bias potential to said substrate;
a counterelectrode between said inductive antenna and said substrate support, wherein said counterelectrode comprises at least one of: (a) silicon, (b) carbon.

15. The apparatus of claim 14 wherein said inductive antenna couples plasma source power to said chamber.

16. The reactor of claim 14 wherein said counterelectrode comprises doped silicon.

17. The reactor of claim 14 wherein:
said plasma precursor gas comprises a fluorine-containing gas; and
said counterelectrode comprises a semiconductor material which is a scavenger for fluorine.

18. The reactor of claim 14 wherein said inductive antenna is adjacent a ceiling of said chamber and overlies said substrate support and said counterelectrode overlies said substrate support.

19. The reactor of claim 18 wherein said inductive antenna comprises a coil conductor.

20. The reactor of claim 19 wherein said coil conductor comprises a planar coil.

21. The reactor of claim 14 wherein said counterelectrode comprises silicon carbide.

22. A plasma reactor for processing a workpiece, said reactor comprising:
a reactor enclosure defining a processing chamber;
a base within said chamber for supporting said workpiece;
a counterelectrode overlying said base; and
an inductive antenna overlying said counterelectrode, wherein said counterelectrode comprises at least one of: (a) silicon, (b) carbon; and
an RF power source connected across said base and said counterelectrode.

23. The reactor of claim 22 wherein said counterelectrode comprises doped silicon.

24. The reactor of claim 22 further comprising a gas inlet of said chamber for providing a fluorine-containing gas, wherein said counterelectrode comprises a semiconductor material which is a scavenger for fluorine.

25. The reactor of claim 24 wherein said fluorine-containing gas comprises a fluorohydrocarbon etch gas.

26. The reactor of claim 22 wherein said counterelectrode comprises silicon carbide.

27. An apparatus for producing a plasma, comprising:
a chamber having a port for a plasma precursor gas to fed to said chamber;
an inductive antenna disposed at a side of said chamber;
a substrate support within said chamber for holding a substrate to be processed in juxtaposition to said inductive antenna;
a counterelectrode between said inductive antenna and said substrate support, wherein said counterelectrode comprises at least one of: (a) silicon, (b) carbon; and
an RF power source connected across said substrate support and said counterelectrode.

28. The apparatus of claim 27 wherein said inductive antenna couples plasma source power to said chamber.

29. The reactor of claim 27 wherein said counterelectrode comprises doped silicon.

30. The reactor of claim 27 wherein:
said plasma precursor gas comprises a fluorine-containing gas; and
said counterelectrode comprises a semiconductor material which is a scavenger for fluorine.

31. The reactor of claim 27 wherein said inductive antenna is adjacent a ceiling of said chamber and overlies said substrate support and said counterelectrode overlies said substrate support.

32. The reactor of claim 31 wherein said inductive antenna comprises a coil conductor.

33. The reactor of claim 32 wherein said coil conductor comprises a planar coil.

34. The reactor of claim 27 wherein said counterelectrode comprises silicon carbide.

* * * * *